US009349459B2

(12) United States Patent
Sakui

(10) Patent No.: US 9,349,459 B2
(45) Date of Patent: May 24, 2016

(54) PROGRAMMING MEMORY CELLS USING SMALLER STEP VOLTAGES FOR HIGHER PROGRAM LEVELS

(71) Applicant: MICRON TECHNOLOGY, INC., Boise, ID (US)

(72) Inventor: Koji Sakui, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 85 days.

(21) Appl. No.: 14/277,301

(22) Filed: May 14, 2014

(65) Prior Publication Data

US 2014/0301145 A1 Oct. 9, 2014

Related U.S. Application Data

(63) Continuation of application No. 13/305,795, filed on Nov. 29, 2011, now Pat. No. 8,737,131.

(51) Int. Cl.

| | |
|---|---|
| ***G11C 11/34*** | (2006.01) |
| ***G11C 16/10*** | (2006.01) |
| ***G11C 11/56*** | (2006.01) |
| ***G11C 16/04*** | (2006.01) |
| ***G11C 16/34*** | (2006.01) |

(52) U.S. Cl.

CPC ........... *G11C 16/10* (2013.01); *G11C 11/5628* (2013.01); *G11C 16/0483* (2013.01); *G11C 16/3427* (2013.01)

(58) Field of Classification Search

CPC ..... G11C 16/10; G11C 16/12; G11C 11/5628

USPC .............. 365/185.18, 185.19, 185.22, 185.24

See application file for complete search history.

(56) References Cited

U.S. PATENT DOCUMENTS

| | | | | |
|---|---|---|---|---|
| 5,715,194 | A | 2/1998 | Hu | |
| 5,822,252 | A | 10/1998 | Lee et al. | |
| 6,172,909 | B1 | 1/2001 | Haddad et al. | |
| 7,349,263 | B2 * | 3/2008 | Kim | G11C 16/12 365/185.19 |
| 7,656,710 | B1 | 2/2010 | Wong | |
| 7,701,775 | B2 | 4/2010 | Kang | |
| 7,952,923 | B2 | 5/2011 | Kim et al. | |
| 8,059,467 | B2 | 11/2011 | Kim et al. | |
| 8,737,131 | B2 * | 5/2014 | Sakui | G11C 11/5628 365/185.18 |
| 2007/0035996 | A1 | 2/2007 | Nakagawa et al. | |
| 2009/0231924 | A1 | 9/2009 | Nakagawa et al. | |

* cited by examiner

*Primary Examiner* — Son Dinh

(74) *Attorney, Agent, or Firm* — Dicke, Billig & Czaja, PLLC

(57) ABSTRACT

Memory devices and methods are disclosed. An embodiment of one such method includes programming a first memory cell to a first program level by applying a first series of programming pulses to a control gate of the first memory cell, where the programming pulses of the first series have voltages that sequentially increase by a certain first voltage; and programming a second memory cell to a second program level that is higher than the first program level by applying a second series of programming pulses to a control gate of the second memory cell, where the programming pulses of the second series have voltages that sequentially increase by a certain second voltage less than the certain first voltage.

20 Claims, 6 Drawing Sheets

Processor 130
134
I/O [7:0]
I/O [15:0]
I/O Control 112
Address Register 114
Status Register 122
Command Register 124
132
CE#
CLE
ALE
WE#
Control Logic 116
Column 110
Row 108
Memory Array 104
Data Register 120
Cache Register 118
100

PROGRAMMING MEMORY CELLS USING SMALLER STEP VOLTAGES FOR HIGHER PROGRAM LEVELS

RELATED APPLICATION

This application is a continuation of U.S. application Ser. No. 13/305,795, titled "PROGRAMMING MEMORY CELLS USING SMALLER STEP VOLTAGES FOR HIGHER PROGRAM LEVELS," filed Nov. 29, 2011 and issued as U.S. Pat. No. 8,737,131 on May 27, 2014, which is commonly assigned and incorporated in its entirety herein by reference.

FIELD

The present disclosure relates generally to memories, and, in particular, the present disclosure relates to programming memory cells using smaller step voltages for higher program levels.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices (e.g., NAND, NOR, etc.) have developed into a popular source of non-volatile memory for a wide range of electronic applications. Non-volatile memory is memory that can retain its data values for some extended period without the application of power. Flash memory devices typically use a one-transistor memory cell that allows for high memory densities, high reliability, and low power consumption. Changes in threshold voltage of the memory cells, through programming (which is sometimes referred to as writing) of charge-storage structures (e.g., floating gates or charge traps) or other physical phenomena (e.g., phase change or polarization), determine the data value of each memory cell. Common uses for flash memory and other non-volatile memory may include personal computers, personal digital assistants (PDAs), digital cameras, digital media players, digital recorders, games, appliances, vehicles, wireless devices, mobile telephones, and removable memory modules, and the uses for non-volatile memory continue to expand.

In a NOR flash architecture, a column of memory cells are coupled in parallel with each memory cell coupled to a data line, such as a bit line. A "column" refers to a group of memory cells that are commonly coupled to a local data line, such as a local bit line. It does not require any particular orientation or linear relationship, but instead refers to the logical relationship between memory cell and data line.

Typically, the array of memory cells for NAND flash memory devices is arranged such that the control gate of each memory cell of a row of the array is connected together to form an access line, such as a word line. Columns of the array include strings (often termed NAND strings) of memory cells connected together in series, e.g., source to drain, between a pair of select lines, e.g., a source select line and a drain select line. The source select line includes a source select gate at each intersection between a NAND string and the source select line, and the drain select line includes a drain select gate at each intersection between a NAND string and the drain select line. Each source select gate is connected to a source line, while each drain select gate is connected to a data line, such as column bit line.

In order for memory manufacturers to remain competitive, memory designers are constantly trying to increase the density of memory devices. One way to increase the density is by using multilevel memory cells (MLCs). Multilevel memory cells take advantage of the analog nature of a traditional flash memory cell by assigning a respective data value (e.g., as represented by a bit pattern) to each of a plurality of program levels, e.g., to each of a plurality of distinct ranges of threshold voltages (Vt) that can be stored on the memory cells. This technology permits the storage of two or more bits per memory cell, depending on the quantity of program levels, and the stability of threshold voltages during the lifetime operation of the memory cells. The number of program levels, which are sometimes also referred to as threshold-voltage-distribution windows, used to represent a bit pattern of N bits may be $2^N$.

Each program level may be characterized by a corresponding distinct range of threshold voltages and a threshold voltage (e.g., that may be referred to as a nominal threshold voltage) at the center of the program level (e.g., the center of the range). A margin (e.g., a certain number of volts), such as a dead space, may separate adjacent program levels, e.g., to facilitate differentiating between data values.

With time (e.g., after a certain retention time), the range of threshold voltages of memory cells programmed to a particular program level may spread out as individual memory cell threshold voltages shift (e.g., due to capacitive coupling, read disturb, charge leakage, etc.) so that the range of threshold voltages corresponding to the program level becomes wider than when initially programmed. In particular, the amount of spreading may be greater at higher program levels (e.g., program levels having higher nominal threshold voltages), resulting in wider ranges at the higher program levels. The wider ranges may cause the higher program levels to be closer together with time, such that the margins between these program levels become narrower. This can cause difficulties when trying to differentiate between possible data values of a memory cell.

For the reasons stated above, and for other reasons stated below which will become apparent to those skilled in the art upon reading and understanding the present specification, there is a need in the art for alternatives to programming memory cells.

DETAILED DESCRIPTION

Figure 1:
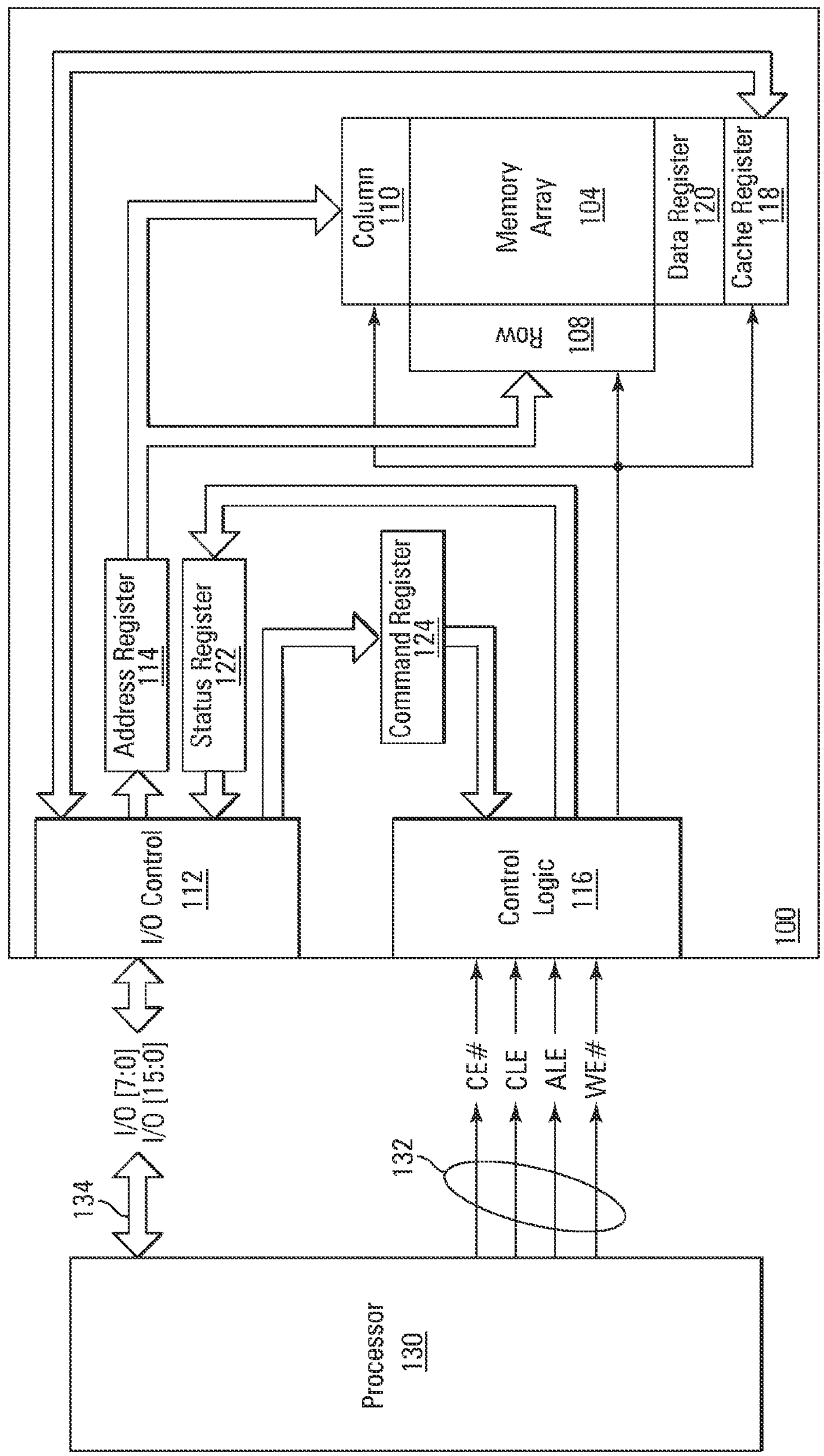
FIG. 1 is a simplified block diagram of a memory system, according to an embodiment.

In the following detailed description, reference is made to the accompanying drawings that form a part hereof, and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

FIG. 1 is a simplified block diagram of a NAND flash memory device 100 in communication with a processor 130 as part of an electronic system, according to an embodiment. The processor 130 may be a memory controller or other external host device. Memory device 100 includes an array of memory cells 104. A row decoder 108 and a column decoder 110 are provided to decode address signals. Address signals are received and decoded to access memory array 104.

Memory device 100 also includes input/output (I/O) control circuitry 112 to manage input of commands, addresses, and data to the memory device 100 as well as output of data and status information from the memory device 100. An address register 114 is in communication with I/O control circuitry 112, and row decoder 108 and column decoder 110, to latch the address signals prior to decoding. A command register 124 is in communication with I/O control circuitry 112 and control logic 116 to latch incoming commands. Control logic 116 controls access to the memory array 104 in response to the commands and generates status information for the external processor 130. The control logic 116 is in communication with row decoder 108 and column decoder 110 to control the row decoder 108 and column decoder 110 in response to the addresses.

For some embodiments, control logic 116 may be configured to cause memory device 100 to perform the various methods of programming memory array 104 disclosed herein. That is, control logic 116 may be configured to cause memory device 100 to program one or more target memory cells coupled to an access line (e.g., a word line) as multilevel cells (MLCs). For example, control logic 116 may be configured to cause memory device 100 to reduce the step voltage, added to programming pulses during programming, with higher program levels.

Control logic 116 is also in communication with a cache register 118. Cache register 118 latches data, either incoming or outgoing, as directed by control logic 116 to temporarily store data while the memory array 104 is busy writing or reading, respectively, other data. During a write operation, data is passed from the cache register 118 to data register 120 for transfer to the memory array 104; then new data is latched in the cache register 118 from the I/O control circuitry 112. During a read operation, data is passed from the cache register 118 to the I/O control circuitry 112 for output to the external processor 130; then new data is passed from the data register 120 to the cache register 118. A status register 122 is in communication with I/O control circuitry 112 and control logic 116 to latch the status information for output to the processor 130.

Memory device 100 receives control signals at control logic 116 from processor 130 over a control link 132. The control signals may include at least a chip enable CE#, a command latch enable CLE, an address latch enable ALE, and a write enable WE#. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114. The data are received over input/output (I/O) pins [7:0] for an 8-bit device or input/output (I/O) pins [15:0] for a 16-bit device at I/O at control circuitry 112 and are written into cache register 118. The data are subsequently written into data register 120 for programming memory array 104. For another embodiment, cache register 118 may be omitted, and the data are written directly into data register 120. Data are also output over input/output (I/O) pins [7:0] for an 8-bit device or input/output (I/O) pins [15:0] for a 16-bit device.

It will be appreciated by those skilled in the art that additional circuitry and signals can be provided, and that the memory device of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins may be used in the various embodiments.

Figure 2:
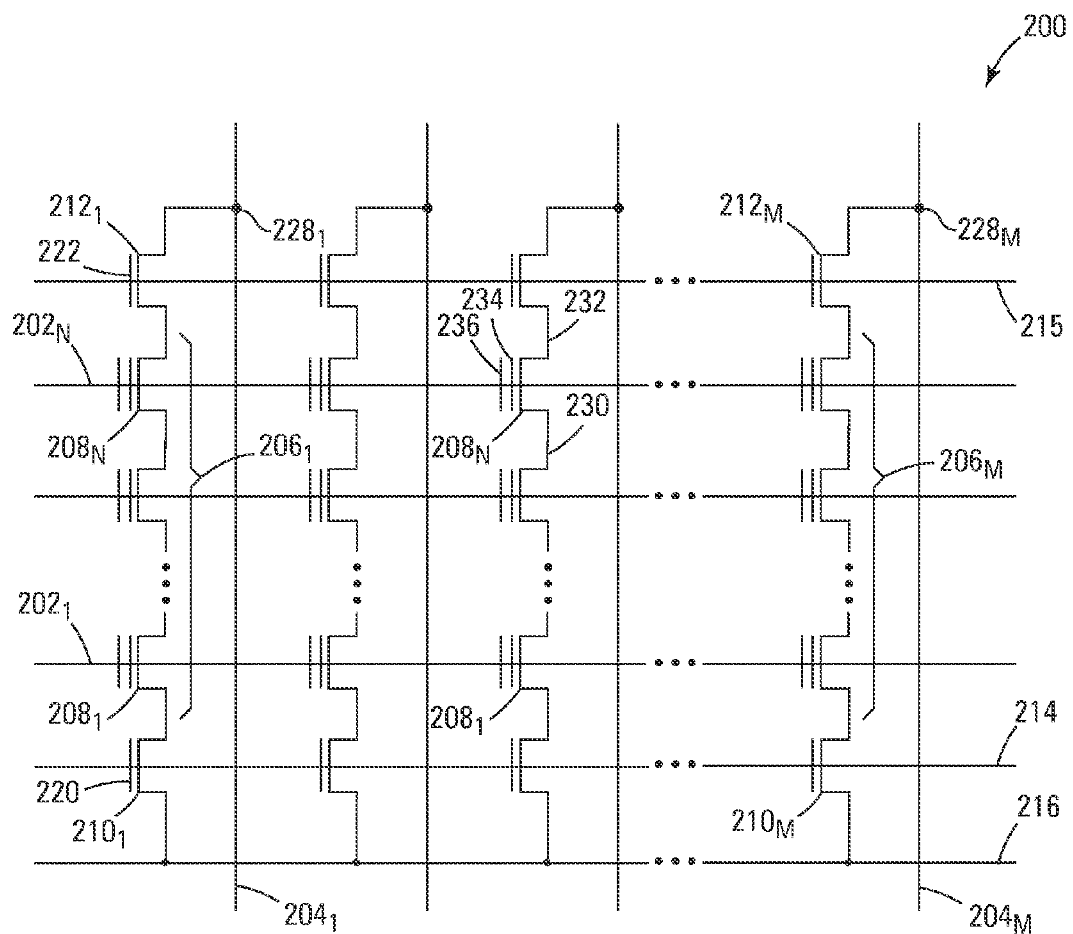
FIG. 2 is a schematic of a NAND memory array, according to another embodiment.

FIG. 2 is a schematic of a NAND memory array 200, e.g., as a portion of memory array 104, in accordance with another embodiment. Memory array 200 includes access lines, such as word lines $\mathbf{202}_1$ to $\mathbf{202}_N$, and intersecting data lines, such as bit lines $\mathbf{204}_1$ to $\mathbf{204}_M$. For ease of addressing in the digital environment, the number of word lines 202 and the number of bit lines 204 are each some power of two, e.g., 256 word lines 202 by 4,096 bit lines 204. The bit lines 204 may be coupled to global data lines, such as global bit lines (not shown), in a many-to-one relationship.

Memory array 200 is arranged in rows (each corresponding to a word line 202) and columns (each corresponding to a bit line 204). Each column may include a string, such as one of NAND strings $\mathbf{206}_1$ to $\mathbf{206}_M$. Each NAND string 206 is coupled to a common source line 216 and includes memory cells $\mathbf{208}_1$ to $\mathbf{208}_N$, each located at an intersection of a word line 202 and a bit line 204. The memory cells 208 represent non-volatile memory cells for storage of data. The memory cells 208 of each NAND string 206 are connected in series, source to drain, between a source select line 214 and a drain select line 215.

Source select line 214 includes a source select gate 210, e.g., a field-effect transistor (FET), at each intersection between a NAND string 206 and source select line 214, and drain select line 215 includes a drain select gate 212, e.g., a field-effect transistor (FET), at each intersection between a NAND string 206 and drain select line 215. In this way, the memory cells 208 of each NAND string 206 are connected between a source select gate 210 and a drain select gate 212.

A source of each source select gate 210 is connected to common source line 216. The drain of each source select gate 210 is connected to the source of the memory cell 208 of the corresponding NAND string 206. For example, the drain of source select gate $\mathbf{210}_1$ is connected to the source of memory cell $\mathbf{208}_1$ of the corresponding NAND string $\mathbf{206}_1$. Therefore, each source select gate 210 selectively couples a corresponding NAND string 206 to common source line 216. A control gate 220 of each source select gate 210 is connected to source select line 214.

The drain of each drain select gate 212 is connected to the bit line 204 for the corresponding NAND string at a drain contact 228. For example, the drain of drain select gate $\mathbf{212}_1$ is connected to the bit line $\mathbf{204}_1$ for the corresponding NAND string $\mathbf{206}_1$ at drain contact $\mathbf{228}_1$. The source of each drain select gate 212 is connected to the drain of a memory cell $\mathbf{208}_N$ of the corresponding NAND string 206. For example, the source of drain select gate $\mathbf{212}_1$ is connected to the drain of memory cell $\mathbf{208}_N$ of the corresponding NAND string $\mathbf{206}_1$. Therefore, each drain select gate 212 selectively couples a corresponding NAND string 206 to a corresponding bit line 204. A control gate 222 of each drain select gate 212 is connected to drain select line 215.

Typical construction of memory cells 208 includes a source 230 and a drain 232, a charge-storage structure 234 (e.g., a floating gate, charge trap, etc.) that can store a charge that determines a data value of the memory cell, and a control gate 236, as shown in FIG. 2. Memory cells 208 have their control gates 236 coupled to (and in some cases from) a word line 202. A column of the memory cells 208 is a NAND string 206 coupled to a given bit line 204. A row of the memory cells 208 are those memory cells commonly coupled to a given word line 202.

Although the examples of FIGS. 1 and 2 were discussed in conjunction with NAND flash, the embodiments described herein are not limited to NAND flash, but can include other flash architectures, such as NOR flash, etc.

Figure 3A:
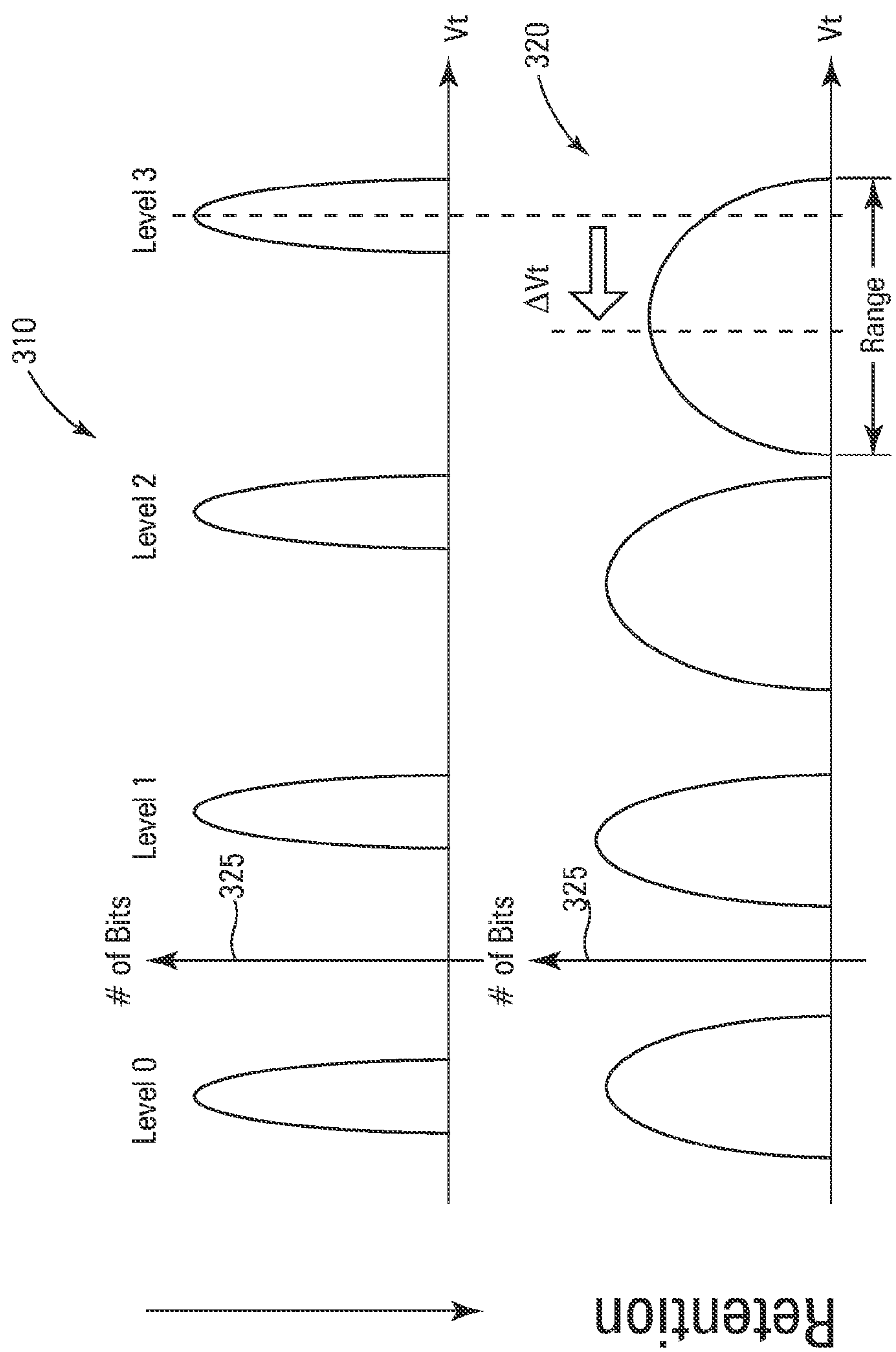
FIG. 3A illustrates program levels according to the prior art and the program levels according to the prior art at a certain time after programming.

FIG. 3A illustrates a plot 310 of a plurality of program levels 0-3, according to the prior art. Program level 0 may represent an initial program level and program levels 1-3 may represent program levels to which target memory cell(s) may be further programmed, according to the prior art. FIG. 3A also illustrates a plot 320 of those program levels after a certain time has elapsed after programming (e.g. that may be referred to as a retention time). In the depicted embodiment, program level 0 corresponds to erased memory cells (which, in some embodiments, might have been "softly" programmed after erasure) whose threshold voltages may be negative. For example, level 0 may be referred to as an erase level. It is noted that the various plots of program levels depicted herein are intended to illustrate the concepts discussed herein, and are not intended to represent actual data.

Note that with time, each of the program levels (e.g., each of the distinct ranges of threshold voltages corresponding to the program level) may spread out, i.e., become wider, as depicted in FIG. 3A. For example, the respective width of each of the distinct ranges of threshold voltages increases with time, in that the memory cells programmed to the different levels tend to discharge to the neutral threshold voltage (e.g., a threshold voltage of zero volts), corresponding to the axis 325 in FIG. 3A. Furthermore, the farther a memory cell's threshold voltage is from the neutral threshold voltage, the greater the expected shift.

In an example, erase level 0 may correspond to a data value of binary 11, program level 1 may correspond to a data value of binary 10, program level 2 may correspond to a data value of binary 00, and program level 3 may correspond to a data value of binary 01. Note that the nominal threshold voltage at the center of each program level tends toward the neutral threshold voltage with time. This results in the nominal threshold voltages corresponding to program levels 1, 2, and 3 decreasing with time and the nominal threshold voltage corresponding to erase level 0 increasing with time.

Figure 3B:
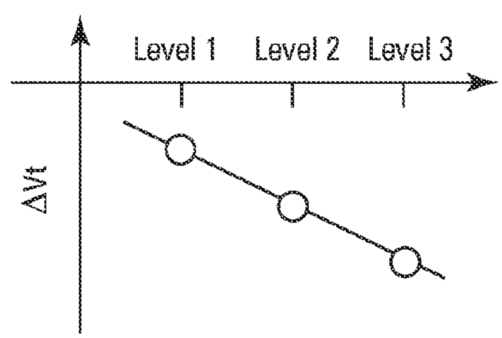
FIG. 3B illustrates the effect of the program level on the change of the threshold voltage at the center of program levels, resulting from threshold voltage shift with time.
Figure 3C:
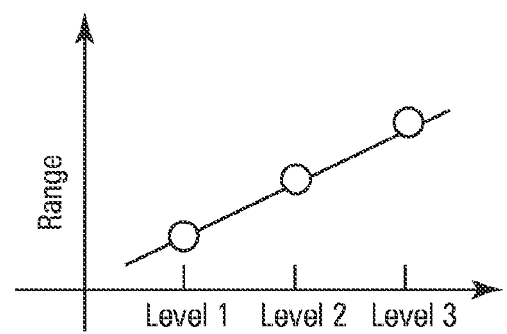
FIG. 3C illustrates the effect of the program level on the corresponding range of threshold voltages, resulting from threshold voltage shift with time.

The amount of decrease in the nominal threshold voltage and the amount of increase in the width of a threshold voltage range at a certain retention time are seen to increase as the program level increases, e.g., as the nominal threshold voltage levels get further away from the neutral threshold voltage. For example, the amount of decrease in the nominal threshold voltage and the amount of increase in the width of a threshold voltage range at a certain retention time are seen to increase in going from program level 1 to program level 2 and in going from program level 2 to program level 3, as respectively shown in FIGS. 3B and 3C. The larger increase in the width of threshold voltage range at the higher program levels acts to decrease the width of the margins between the program levels at the higher program levels. For example, the margin between the program levels 2 and 3 is narrower than the margin between the program levels 1 and 2, making it more difficult to differentiate between level 2 and level 3 during a read operation.

During programming of an individual memory cell, the memory cell's threshold voltage is altered by moving, e.g., shifting, the program threshold voltage of the memory cell from its initial program level to fall within the program level corresponding to the desired data value for that memory cell. The threshold voltage of a memory cell is typically programmed by applying a number of programming voltage pulses to a selected access line (e.g., word line) that is coupled to memory cells targeted for programming.

To program a memory cell to program level 1, programming voltage pulses start at an initial voltage, typically insufficient to program the memory cell into the desired threshold voltage range corresponding to program level 1. The programming voltage pulses are increased (e.g., by a step voltage) until the memory cell is programmed to program level 1. If more than one cell coupled to a selected access line is to be programmed to program level 1, programming pulses are applied to control gates of those memory cells until at least a threshold number of those memory cells (which in some cases could be all of those cells) are programmed to program level 1.

To program a memory cell to program level 2, programming voltage pulses start at an initial voltage that is higher than the initial voltage for program level 1, but typically insufficient to program the memory cell to program level 2. The programming voltage pulses are increased (e.g., by substantially the same step voltage as for program level 1) until the memory cell is programmed to program level 2. If more than one memory cell coupled to a selected access line is to be programmed to program level 2, programming pulses are applied to control gates of those memory cells until at least a threshold number of those memory cells (which in some cases could be all of those memory cells) are programmed to program level 2.

To program a memory cell to program level 3, programming voltage pulses start at an initial voltage greater than the initial voltage for program level 2, but typically insufficient to program the memory cell to program level 3. The pulses are increased (e.g., by substantially the same step voltage as for program levels 1 and 2) until the memory cell is programmed to program level 3. If more than one cell coupled to a selected access line is to be programmed to program level 3, programming pulses are applied to control gates of those memory cells until at least a threshold number of those memory cells (which in some cases could be all of those memory cells) are programmed to program level 3.

Using substantially the same step voltage for each of levels 1-3 can cause each of the program levels 1-3 to have substantially the same initial range width, as shown in plot 310 of FIG. 3A. For example, the range width may be about 1.4 V for each of levels 1-3.

Figure 4:
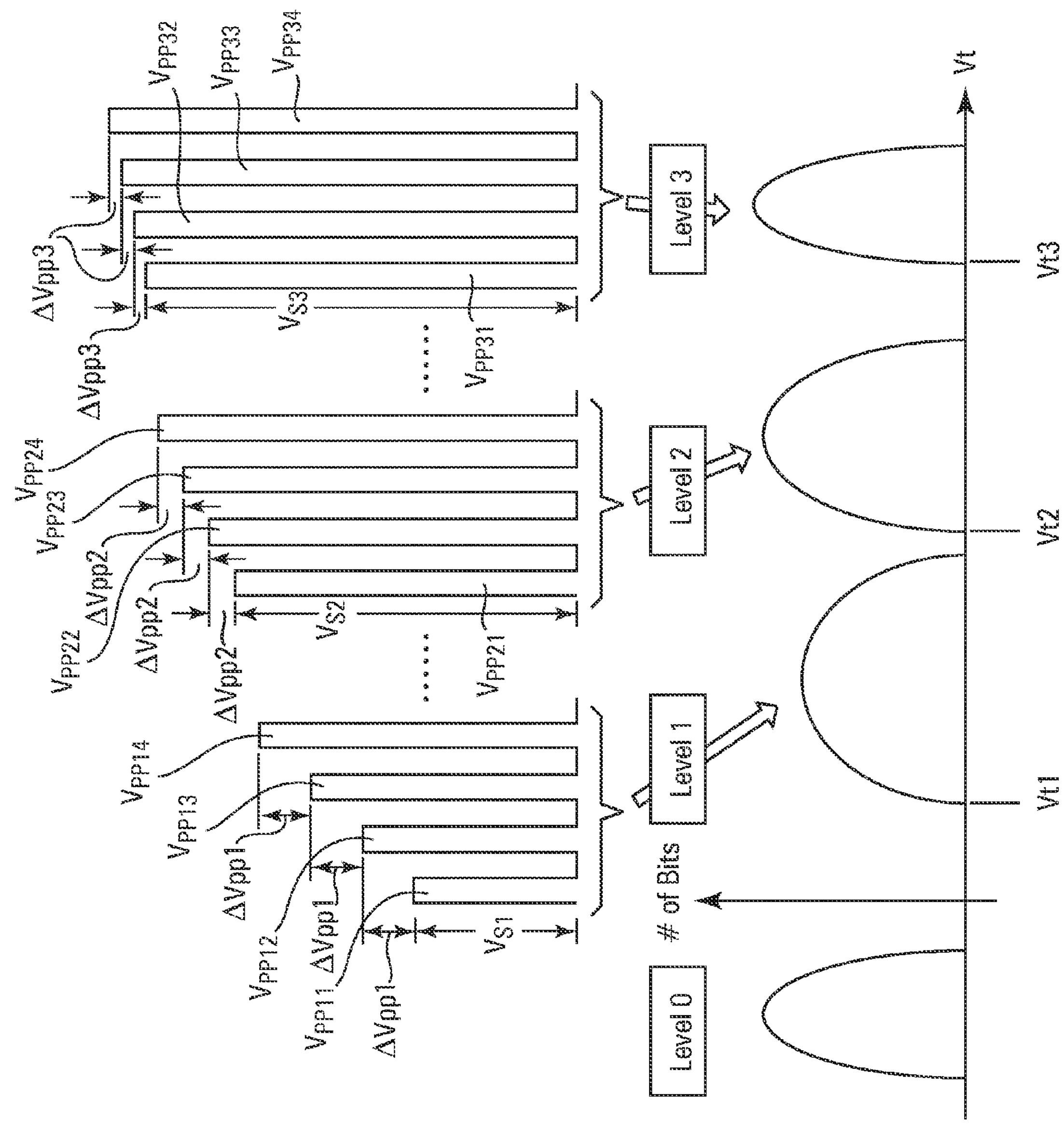
FIG. 4 illustrates programming pulses used to program target memory cells, according to an embodiment.

FIG. 4 illustrates programming pulses used to program target memory cells coupled to a common selected word line as multilevel memory cells, such as one or more target memory cells 208 coupled to a selected word line 202 in FIG. 2. For example, the selected word line 202 may be coupled to the control gates 236 of target memory cells 208. Unselected word lines may be biased by voltages intended to inhibit programming of memory cells coupled to those word lines. Not all memory cells coupled to a selected word line need be targeted for programming. As is known in the art, intersecting bit lines corresponding to memory cells that are not targeted for programming may also be biased to voltages intended to inhibit programming of such memory cells.

Programming the target memory cells involves programming the target memory cells to one of program levels 1, 2, and 3 in FIG. 4. An erase operation may be performed on a block of memory cells containing the one or more memory cells targeted for programming before they are programmed. For example, the memory cells may be erased to (and in some cases "softly" programmed to) have threshold voltages corresponding to erase level 0 in FIG. 4.

For some embodiments, erase level 0 may correspond to a binary 11, program level 1 may correspond to a binary 10, program level 2 may correspond to a binary 00, and program level 3 may correspond to a binary 01 state. For some embodiments, memory cells to be programmed to either level 1 or level 3 may be first programmed to, for example, level 0, and memory cells to be programmed to level 2 may be first programmed to, for example, level 1.

To program target memory cells to level 1, e.g., to have a program threshold voltage of at least Vt1 (e.g., about 0.7 V), a programming voltage pulse $V_{pp11}$, e.g., having an initial programming voltage $V_{S1}$ (e.g., typically insufficient to program a memory cell to a threshold voltage of at least Vt1), may be applied to the selected word line, and thus the control gates of the target memory cells. For example, the target memory cells to be programmed to level 1 may be programmed to have program threshold voltages that lie within a certain range (e.g., having a width of about 1.8 V) of program threshold voltages that may start at the program threshold voltage Vt1.

Subsequently, after applying one or more pulses, the selected word line may be discharged and a program verify performed by applying a program verify voltage to the selected word line. If the program verify indicates that one or more of the target memory cells are programmed to level 1 (e.g., to threshold voltages that equal or exceed Vt1), the programming to level 1 is completed for those memory cells.

If more than a threshold number (which in some cases may be "any") of the target memory cells remain unprogrammed to level 1 (e.g., have threshold voltages that are less than Vt1), the remaining target memory cells unprogrammed to level 1 then receive, at their control gates, a programming voltage pulse $V_{pp12}$, while the target memory cells already programmed to level 1 and other untargeted memory cells associated with the word line are inhibited from programming. In other words, programming voltage pulse $V_{pp12}$ may be applied in response to the program verify determining that some of the target memory cells remain unprogrammed to level 1.

The voltage of programming voltage pulse $V_{pp12}$ may exceed the voltage of programming voltage pulse $V_{pp11}$ by a program voltage step (e.g., a step voltage) ΔVpp1. For example, the voltage of programming voltage pulse $V_{pp12}$ may be obtained by adding the step voltage ΔVpp1 to the voltage of programming voltage pulse $V_{pp11}$, e.g., to the initial programming voltage $V_{S1}$.

If a subsequent program verify indicates that one or more of the remaining target memory cells are now programmed to level 1, the programming for level 1 is completed for those memory cells. This sequence may be repeated, e.g., using programming voltage pulses $V_{pp13}$, $V_{pp14}$, etc., until at least a threshold number (which in some cases may be all or a certain percentage of all) of the target memory cells are programmed to level 1, i.e., until at least a threshold number of target memory cells lie within the certain range for level 1 that may start with the program threshold voltage Vt1.

In other words, for some embodiments, a target memory cell may be programmed to level 1 by applying a series of programming pulses (e.g., programming voltage pulses $V_{pp11}$, $V_{pp12}$, $V_{pp13}$, $V_{pp14}$, etc.) to the control gate of the target memory cell, where the programming voltage pulses of the series have voltages that sequentially increase by the step voltage ΔVpp1.

To program target memory cells (which in some embodiments may have already been programmed to level 1, but in other embodiments are at level 0) to level 2, e.g., to have a program threshold voltage of at least Vt2 (e.g., about 2.7 V), a programming voltage pulse $V_{pp21}$, e.g., having an initial programming voltage $V_{S2}$ (e.g., typically insufficient to program a memory cell to a voltage of at least Vt2) higher than initial programming voltage $V_{S1}$, may be applied to the selected word line. For example, the memory cells to be programmed to level 2 may be programmed to have program threshold voltages that lie within a certain range (e.g., having a width of about 1.4 V) of program threshold voltages that may start at the program threshold voltage Vt2. The width of the range of program threshold voltages of level 2 is less than the width of the range of threshold voltages of level 1. In other words, the initial range of threshold voltages of program level 2 is narrower than the initial range of threshold voltages of program level 1.

Subsequently, the word line may be discharged and a program verify performed. If the program verify indicates that one or more of the target memory cells are programmed to level 2 (e.g., to threshold voltages that lie within the certain range for level 2), the programming to level 2 is completed for those memory cells.

If less than a threshold number of the target memory cells remain unprogrammed to level 2, the remaining target memory cells unprogrammed to level 2 then receive, at their control gates, a programming voltage pulse $V_{pp22}$, while the target memory cells already programmed to level 2 and other untargeted memory cells associated with the word line are inhibited from programming. In other words, programming voltage pulse $V_{pp22}$ may be applied in response to the program verify determining some of the target memory cells remain unprogrammed to level 2.

The voltage of programming voltage pulse $V_{pp22}$ may exceed the voltage of programming voltage pulse $V_{pp21}$ by a program voltage step (e.g., a step voltage) ΔVpp2 that is less than step voltage ΔVpp1 (the step voltage used to program level 1). For example, the voltage of programming voltage pulse $V_{pp22}$ may be obtained by adding the step voltage $\Delta$Vpp2 to the voltage of programming voltage pulse $V_{pp21}$, e.g., to program initial programming voltage $V_{S2}$.

If a subsequent program verify indicates that one or more of the remaining target memory cells are now programmed to level 2, the programming for level 2 is completed for those memory cells. This sequence may be repeated, e.g., using programming voltage pulses $V_{pp23}$, $V_{pp24}$, etc., until at least a threshold number of the target memory cells are programmed to level 2, i.e., until at least the threshold number of the target memory cells lie within the certain range for level 2 that may start with the program threshold voltage Vt2.

In other words, for some embodiments, a target memory cell may be programmed to program level 2 by applying a series programming voltage pulses (e.g., programming voltage pulses $V_{pp21}$, $V_{pp22}$, $V_{pp23}$, $V_{pp24}$, etc.) to the control gate of the target memory cell, where the programming voltage pulses of the series have voltages that sequentially increase by the step voltage $\Delta$Vpp2.

To program target memory cells (which in some embodiments may have already been programmed to level 1 or level 2, but in other embodiments are at level 0) to level 3, e.g., to have a program threshold voltage of at least Vt3 (e.g., about 4.7 V), a programming voltage pulse $V_{pp31}$, e.g., having an initial programming voltage $V_{s3}$ (e.g., typically insufficient to program a memory cell to a threshold voltage of at least Vt3) higher than initial programming voltage $V_{S2}$, may be applied to the selected word line. For example, the memory cells to be programmed to level 3 may be programmed to have program threshold voltages that lie within a certain range (e.g., having a width of about 1.0 V) of program threshold voltages that may start at the program threshold voltage Vt3. The width of the range of program threshold voltages of level 3 is less than the width of the range of program threshold voltages of level 2.

Subsequently, the word line may be discharged and a program verify performed. If the program verify indicates that one or more of the target memory cells are programmed to level 3 (e.g., to threshold voltages that lie within the certain range for level 3), the programming to level 3 is completed for those memory cells.

If less than a threshold number of the target memory cells remain unprogrammed to level 3, the remaining target memory cells unprogrammed to level 3 then receive, at their control gates, a programming voltage pulse $V_{pp32}$, while the target memory cells already programmed to level 3 and other untargeted memory cells associated with the word line are inhibited from programming. In other words, programming voltage pulse $V_{pp32}$ may be applied in response to the program verify determining some of the target memory cells remain unprogrammed to level 3.

The voltage of programming voltage pulse $V_{pp32}$ may exceed the voltage of programming voltage pulse $V_{pp31}$ by a program voltage step (e.g., a step voltage) $\Delta$Vpp3 that is less than step voltage $\Delta$Vpp2 (the step voltage used to program level 2). For example, the voltage of programming voltage pulse $V_{pp32}$ may be obtained by adding the step voltage $\Delta$Vpp3 to the voltage of programming voltage pulse $V_{pp31}$, e.g., to initial programming voltage $V_{S3}$.

If a subsequent program verify indicates that one or more of the remaining target memory cells are now programmed to level 3, the programming for level 3 is completed for those memory cells. This sequence may be repeated, e.g., using programming voltage pulses $V_{pp33}$, $V_{pp34}$, etc., until at least a threshold number of the target memory cells are programmed to level 3, i.e., until at least the threshold number of the target memory cells lie within the certain range for level 3 that may start with the program threshold voltage Vt3.

In other words, for some embodiments, a target memory cell may be programmed to program level 3 by applying a series of programming pulses (e.g., programming voltage pulses $V_{pp31}$, $V_{pp32}$, $V_{pp33}$, $V_{pp34}$, etc.) to the control gate of the target memory cell, where the programming voltage pulses of the series have voltages that sequentially increase by the step voltage $\Delta$Vpp3.

Note that decreasing the step voltage $\Delta$Vpp for higher program levels of the multilevel target memory cells causes the width of the initial program levels (e.g., the width of the initial ranges of threshold voltages corresponding to the program levels) to decrease with higher program levels. That is, a smaller step voltage allows for a narrower initial program level.

For example, the initial threshold voltage range for level 2 is narrower than the initial threshold voltage range for level 1 due to the step voltage $\Delta$Vpp2, used in the programming of the target memory cells to level 2, being less than the step voltage $\Delta$Vpp1 used in the programming of the target memory cells to level 1. Similarly, the initial threshold voltage range for level 3 is narrower than the initial threshold voltage range for level 2 due to the step voltage $\Delta$Vpp3, used in the programming of the target memory cells to level 3, being less than the step voltage $\Delta$Vpp2.

Figure 5:
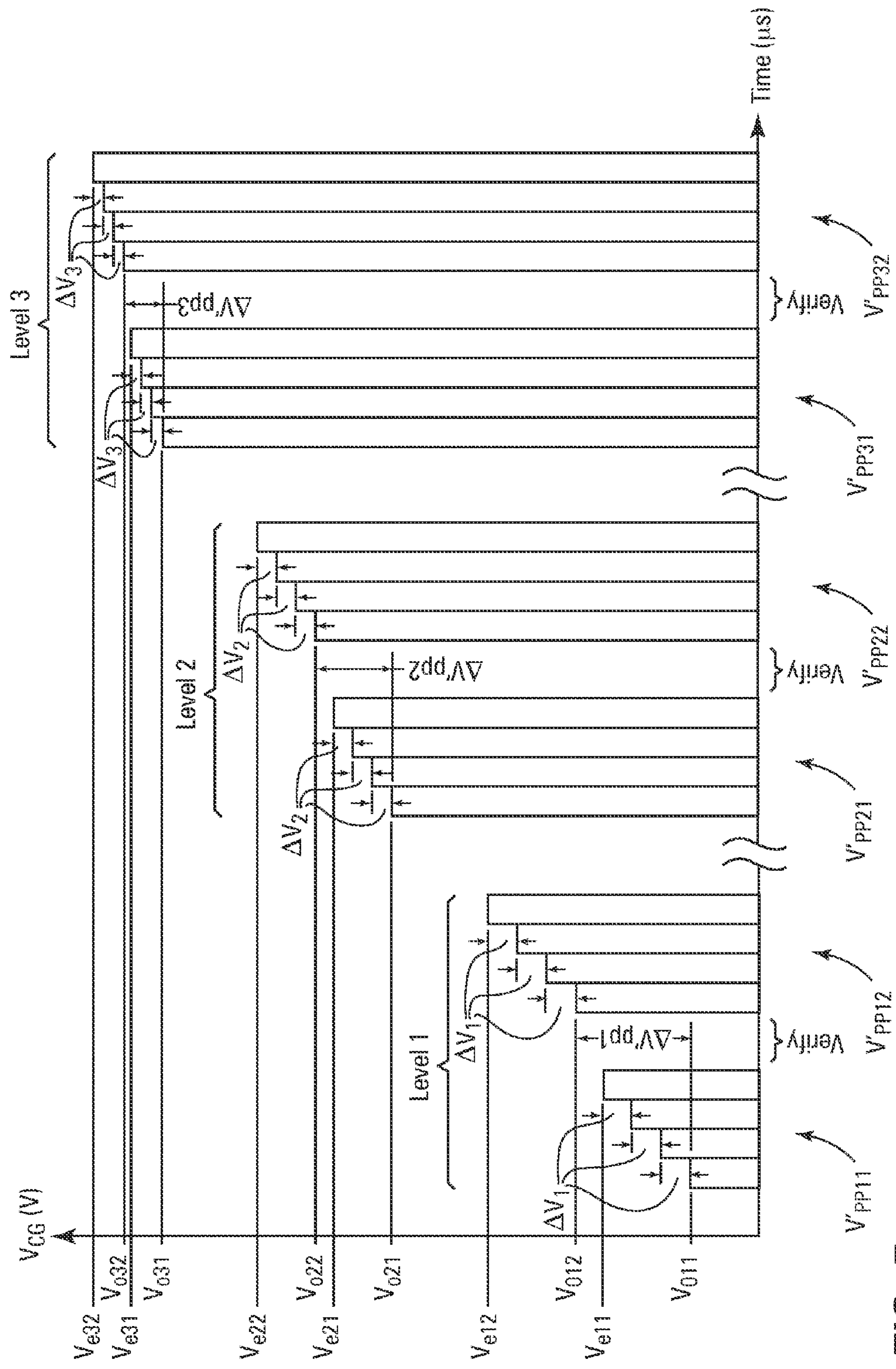
FIG. 5 illustrates programming voltage pulses having time-varying voltage levels that are applied to target memory cells, according to another embodiment.

FIG. 5 illustrates programming voltage pulses having voltages increasing with time that are applied to a selected word line coupled to target memory cells for programming the target memory cells to the levels 1, 2, and 3 of FIG. 4. Each of the programming voltage pulses results from applying an initial voltage, at the start of the pulse, to the selected word line and subsequently increasing (e.g., stepping up) the initial voltage of the pulse to an end voltage at the end of the pulse. A program verify may be performed after the word line is discharged from the end voltage.

To program a memory cell to program level 1, according to FIG. 5, a programming voltage pulse $V'_{pp11}$ (e.g., having an initial voltage that may be insufficient to a memory cell to a program a threshold voltage that lies within the certain range for level 1) having a voltage increasing with time is applied to the selected word line. Subsequently, the selected word line may be discharged and a program verify performed.

If less than a threshold number of the target memory cells remain unprogrammed to level 1, the initial voltage of the programming voltage pulse $V'_{v11}$ may be increased by a step voltage $\Delta$Vpp1 to produce a programming voltage pulse $V'_{pp12}$ having a voltage increasing with time that is subsequently applied to the unprogrammed target memory cells. For example, an initial voltage $V_{012}$ of the programming voltage pulse $V'_{pp12}$ may be set by adding the step voltage $\Delta$V'pp1 to an initial voltage $V_{011}$ of the preceding (e.g., immediately preceding) programming voltage pulse $V'_{p11}$, e.g., $V_{012}=V_{011}+\Delta V'pp1$. In other words, the initial voltage $V_{012}$ of the programming voltage pulse $V'_{pp12}$, in the series of pulses used to program a memory cell to program level 1, is set so the initial voltage $V_{012}$ of the programming voltage pulse $V'_{pp12}$ exceeds the initial voltage $V_{011}$ of the preceding (e.g., immediately preceding) programming voltage pulse $V'_{pp11}$, in the series of pulses used to program the memory cell to program level 1, by the step voltage $\Delta$V'pp1.

Applying the programming voltage pulse $V'_{pp11}$ to the selected word line may include applying the initial voltage $V_{011}$ of programming voltage pulse $V'_{pp11}$ to the selected word line. The voltage of the pulse $V'_{pp11}$ may then be increased, step by step, in a plurality sub-steps until an end voltage $V_{e11}$ of programming voltage pulse $V'_{pp11}$ is reached.

In other words, the voltage of the programming voltage pulse $V'_{pp11}$ may increase with time from the initial voltage $V_{011}$ to the end voltage $V_{e11}$.

For some embodiments, the voltage of the pulse $V'_{pp11}$ may be increased in a series of voltage sub-steps $\Delta V_1=\Delta V'pp1/m_1$ until the end voltage $V_{e11}$ is reached. For example, $m_1$ may be set equal to the number of different voltages of programming voltage pulse $V'_{pp11}$ (e.g., four in the example of FIG. 5). That is, each voltage sub-step $\Delta V_1$ is a fraction of ΔV'pp1. In other words, the programming voltage pulse $V'_{pp11}$ may be generated on the selected word line by applying the initial voltage $V_{011}$ to the word line and subsequently increasing the voltage on the word line to the end voltage $V_{e11}$ in a series of voltage sub-steps $\Delta V_1$. It will be clear that as the number of sub-steps is increased, the programming voltage pulse $V'_{pp11}$ can approach a ramped voltage.

In response to the word line, and thus the control gates of the target memory cells, reaching the end voltage level $V_{e11}$, the word line may be discharged from the end voltage level $V_{e11}$, and the program verify performed. If the program verify indicates that one or more of the target memory cells are programmed to level 1 (e.g., to threshold voltages that lie within the certain range for level 1), the programming to level 1 is completed for those memory cells. For some embodiments, end voltage $V_{e11}$ may be substantially the same as the initial programming voltage $V_{S1}$ in FIG. 4, e.g., substantially the same as the voltage of voltage pulse $V_{pp11}$ in FIG. 4, and the step voltage ΔV'pp1 may be substantially the same as the step voltage ΔVpp1 in FIG. 4.

If less than a threshold number (which again, in some embodiments, could be all) of the target memory cells remain unprogrammed to level 1, the step voltage ΔV'pp1 is added to initial voltage $V_{011}$ of programming voltage pulse $V'_{pp11}$ to produce programming voltage pulse $V'_{pp12}$. Programming voltage pulse $V'_{pp12}$ is then applied to the selected word line. These remaining target memory cells unprogrammed to level 1 receive programming voltage pulse $V'_{pp12}$ while the target memory cells already programmed to level 1 and other untargeted memory cells associated with the word line are inhibited from programming. Note that programming voltage pulse $V'_{pp11}$ and programming voltage pulse $V'_{pp12}$ may be substantially the same (e.g., the same), except that the respective voltages of programming voltage pulse $V'_{pp12}$ are respectively higher than the respective voltages of programming voltage pulse $V'_{pp11}$ by the voltage step ΔV'pp1.

Applying the programming voltage pulse $V'_{pp12}$ to the selected word line may include setting the initial voltage $V_{012}$ of programming voltage pulse $V'_{pp12}$ to $V_{012}=V_{011}+\Delta V'pp1$ and applying the initial voltage $V_{012}$ of programming voltage pulse $V'_{pp12}$ to the selected word line. The voltage on the selected word line may then be increased, step by step, in a plurality sub-steps until an end voltage $V_{e12}$ is reached. In other words, the voltage of the programming voltage pulse $V'_{pp12}$ may increase with time from the initial voltage $V_{012}$ to the end voltage $V_{e12}$.

The voltage of the programming voltage pulse $V'_{pp12}$ may increase at substantially the same rate (e.g., the same rate) as the voltage of the programming voltage pulse $V'_{pp11}$. For example, the voltage of pulse $V'_{pp12}$ may be increased in the same series of voltage sub-steps $\Delta V_1$ as the voltage of pulse $V'_{pp11}$. In other words, the programming voltage pulse $V'_{pp12}$ may be generated on the selected word line by applying the initial voltage $V_{012}$ to the word line and by subsequently increasing the voltage on the word line to the end voltage $V_{e12}$ in a series of voltage sub-steps $\Delta V_1$. It will be clear that as the number of sub-steps in increased, the programming voltage pulse $V'_{pp12}$ can approach a ramped voltage.

For some embodiments, end voltage $V_{e12}$ may be substantially the same as the voltage of voltage pulse $V_{pp12}$ in FIG. 4. In response to the word line, and thus the control gates of the target memory cells, reaching the end voltage $V_{e12}$, the word line may be discharged from the end voltage $V_{e12}$, and the program verify performed.

To program a memory cell to program level 2, according to FIG. 5, a programming voltage pulse $V'_{pp21}$ (e.g., having an initial voltage that may be insufficient to a memory cell to a program a threshold voltage that lies within the certain range for level 2) having a voltage increasing with time is applied to the selected word line. Subsequently, the selected word line may be discharged and a program verify performed.

If less than a threshold number of the target memory cells remain unprogrammed to level 2, the initial voltage of the programming voltage pulse $V'_{pp21}$ may be increased by a step voltage ΔV'pp2 that is less than step voltage ΔV'pp1 to produce a programming voltage pulse $V'_{pp22}$ having a voltage increasing with time that is subsequently applied to the unprogrammed target memory cells. For example, an initial voltage $V_{022}$ of the programming voltage pulse $V'_{pp22}$ may be set by adding the step voltage ΔV'pp2 to an initial voltage $V_{021}$ of the preceding (e.g., immediately preceding) programming voltage pulse $V'_{v21}$, e.g., $V_{022}=V_{021}+\Delta V'pp2$. In other words, the initial voltage $V_{022}$ of the programming voltage pulse $V'_{pp22}$, in the series of pulses used to program a memory cell to program level 2, is set so the initial voltage $V_{022}$ of the programming voltage pulse $V'_{pp22}$ exceeds the initial voltage $V_{021}$ of the preceding (e.g., immediately preceding) programming voltage pulse $V'_{v21}$, in the series of pulses used to program the memory cell to program level 2, by the step voltage ΔV'pp2.

Note that the voltages of the programming voltage pulses $V'_{pp21}$ and $V'_{pp22}$ used to program a memory cell to level 2 are higher than the voltages of the programming voltage pulses $V'_{pp11}$ and $V'_{pp12}$ used to program a memory cell to level 1. That is, initial voltages $V_{021}$ and $V_{022}$ of the programming voltage pulses $V'_{pp21}$ and $V'_{pp22}$ are higher than the initial voltages $V_{011}$ and $V_{012}$ and the end voltages $V_{e11}$ and $V_{e12}$ of the programming voltage pulses $V'_{pp11}$ and $V'_{pp12}$. Moreover, the initial voltage $V_{021}$ of the first programming voltage pulse $V'_{pp21}$ applied to program a memory cell to level 2 may be higher than the end voltage of the last programming voltage pulse applied to program a memory cell to level 1.

Applying the programming voltage pulse $V'_{pp21}$ to the selected word line may include applying the initial voltage $V_{021}$ of programming voltage pulse $V'_{pp21}$ to the selected word line. The voltage of the pulse $V'_{pp21}$ may then be increased, step by step, in a plurality sub-steps until an end voltage $V_{e21}$ of programming voltage pulse $V'_{pp21}$ is reached. In other words, the voltage of the programming voltage pulse $V'_{pp21}$ may increase with time from the initial voltage $V_{021}$ to the end voltage $V_{e21}$. Note that the voltage of the programming voltage pulse $V'_{pp21}$ increases at a lower rate than the voltage of the programming voltage pulses $V'_{pp11}$ and $V'_{pp12}$ for level 1.

For some embodiments, the voltage of the pulse $V'_{pp21}$ may be increased in a series of voltage sub-steps $\Delta V_2=\Delta V'pp2/m_2$ until the end voltage $V_{e21}$ is reached. For example, $m_2$ may be set equal to the number of different voltages of programming voltage pulse $V'_{pp21}$ (e.g., four in the example of FIG. 5). That is, each voltage sub-step $\Delta V_2$ is a fraction of ΔV'pp2 and is less than the voltage sub-steps $\Delta V_1$ used for level 1. In other words, the programming voltage pulse $V'_{pp21}$ may be generated on the selected word line by applying the initial voltage $V_{021}$ to the word line and subsequently increasing the voltage on the word line to the end voltage $V_{e21}$ in a series of voltage sub-steps $\Delta V_2$.

In response to the word line, and thus the control gates of the target memory cells, reaching the end voltage $V_{e21}$, the word line may be discharged from the end voltage $V_{e21}$, and the program verify performed. If the program verify indicates that one or more of the target memory cells are programmed to level 2 (e.g., to threshold voltages that lie within the certain range for level 2), the programming to level 2 is completed for those memory cells. For some embodiments, end voltage $V_{e21}$ may be substantially the same as the initial programming voltage $V_{S2}$ in FIG. 4, e.g., substantially the same as the voltage of voltage pulse $V_{pp21}$ in FIG. 4, and the step voltage ΔV'pp2 may be substantially the same as the step voltage ΔVpp2 in FIG. 4.

If less than a threshold number (which again, in some embodiments, could be all) of the target memory cells remain unprogrammed to level 2, the step voltage ΔV'pp2 is added to initial voltage $V_{021}$ of programming voltage pulse $V'_{pp21}$ to produce programming voltage pulse $V'_{pp22}$. Programming voltage pulse $V'_{pp22}$ is then applied to the selected word line. These remaining target memory cells unprogrammed to level 2 receive programming voltage pulse $V'_{pp22}$ while the target memory cells already programmed to level 2 and other untargeted memory cells associated with the word line are inhibited from programming. Note that programming voltage pulse $V_{pp21}$ and programming voltage pulse $V'_{pp22}$ may be substantially the same (e.g., the same), except that the respective voltages of programming voltage pulse $V'_{pp22}$ are respectively higher than the respective voltages of programming voltage pulse $V'_{pp21}$ by the voltage step ΔV'pp2.

Applying the programming voltage pulse $V'_{pp22}$ to the selected word line may include setting the initial voltage $V_{022}$ of programming voltage pulse $V'_{pp22}$ to $V_{022}=V_{021}+\Delta V'pp2$ and applying the initial voltage $V_{022}$ of programming voltage pulse $V'_{pp22}$ to the selected word line. The voltage on the selected word line may then be increased, step by step, in a plurality sub-steps until an end voltage $V_{e22}$ is reached. In other words, the voltage of the programming voltage pulse $V'_{pp22}$ may increase with time from the initial voltage $V_{022}$ to the end voltage $V_{e22}$.

The voltage of the programming voltage pulse $V'_{pp22}$ may increase at substantially the same rate (e.g., the same rate) as the voltage of the programming voltage pulse $V'_{pp21}$. For example, the voltage of pulse $V'_{pp22}$ may be increased in the same series of voltage sub-steps $\Delta V_2$ as the voltage of pulse $V'_{pp21}$. In other words, the programming voltage pulse $V'_{pp22}$ may be generated on the selected word line by applying the initial voltage $V_{022}$ to the word line and by subsequently increasing the voltage on the word line to the end voltage $V_{e22}$ in a series of voltage sub-steps $\Delta V_2$. For some embodiments, end voltage $V_{e22}$ may be substantially the same as the voltage of voltage pulse $V_{pp22}$ in FIG. 4. In response to the word line, and thus the control gates of the target memory cells, reaching the end voltage $V_{e22}$, the word line may be discharged from the end voltage $V_{e22}$, and the program verify performed.

To program a memory cell to program level 3, according to FIG. 5, a programming voltage pulse $V'_{pp31}$ (e.g., having an initial voltage that may be insufficient to a memory cell to a program a threshold voltage that lies within the certain range for level 3) having a voltage increasing with time is applied to the selected word line. Subsequently, the selected word line may be discharged and a program verify performed.

If less than a threshold number of the target memory cells remain unprogrammed to level 3, the initial voltage of the programming voltage pulse $V'_{pp31}$ may be increased by a step voltage ΔV'pp3 that is less than step voltage ΔV'pp2 to produce a programming voltage pulse $V'_{pp32}$ having a voltage increasing with time that is subsequently applied to the unprogrammed target memory cells. For example, an initial voltage $V_{032}$ of the programming voltage pulse $V'_{pp32}$ may be set by adding the step voltage ΔV'pp3 to an initial voltage $V_{031}$ of the preceding (e.g., immediately preceding) programming voltage pulse $V'_{pp31}$, e.g., $V_{032}=V_{031}+\Delta V'pp3$. In other words, the initial voltage $V_{032}$ of the programming voltage pulse $V'_{pp32}$, in the series of pulses used to program a memory cell to program level 3, is set so the initial voltage $V_{032}$ of the programming voltage pulse $V'_{pp32}$ exceeds the initial voltage $V_{031}$ of the preceding (e.g., immediately preceding) programming voltage pulse $V'_{pp31}$, in the series of pulses used to program the memory cell to program level 3, by the step voltage ΔV'pp3. It will be clear that as the number of sub-steps in increased, the programming voltage pulse $V'_{pp31}$ can approach a ramped voltage.

Note that the voltages of the programming voltage pulses $V'_{pp31}$ and $V'_{pp32}$ used to program a memory cell to level 3 are higher than the voltages of the programming voltage pulses $V'_{pp21}$ and $V'_{pp22}$ used to program a memory cell to level 2. That is, initial voltages $V_{031}$ and $V_{032}$ of the programming voltage pulses $V'_{pp31}$ and $V'_{pp32}$ are higher than the initial voltages $V_{021}$ and $V_{022}$ and the end voltages $V_{e21}$ and $V_{e22}$ of the programming voltage pulses $V'_{pp21}$ and $V'_{pp22}$. Moreover, the initial voltage $V_{031}$ of the first programming voltage pulse $V'_{pp31}$ applied to program a memory cell to level 3 may be higher than the end voltage of the last programming voltage pulse applied to program a memory cell to level 3.

Applying the programming voltage pulse $V'_{pp31}$ to the selected word line may include applying the initial voltage $V_{031}$ of programming voltage pulse $V'_{pp31}$ to the selected word line. The voltage of the pulse $V'_{pp31}$ may then be increased, step by step, in a plurality sub-steps until an end voltage $V_{e31}$ of programming voltage pulse $V'_{pp31}$ is reached. In other words, the voltage of the programming voltage pulse $V'_{pp31}$ may increase with time from the initial voltage $V_{031}$ to the end voltage $V_{e31}$. Note that the voltage of the programming voltage pulse $V'_{pp31}$ increases at a lower rate than the voltage of the programming voltage pulses $V'_{pp21}$ and $V'_{pp22}$ for level 2.

For some embodiments, the voltage of the pulse $V'_{pp31}$ may be increased in a series of voltage sub-steps $\Delta V_3=\Delta V'pp3/m_3$ until the end voltage $V_{e31}$ is reached. For example, $m_3$ may be set equal to the number of different voltages of programming voltage pulse $V'_{pp31}$ (e.g., four in the example of FIG. 5). That is, each voltage sub-step $\Delta V_3$ is a fraction of ΔV'pp3 and is less than the voltage sub-steps $\Delta V_3$ used for level 2. In other words, the programming voltage pulse $V'_{pp31}$ may be generated on the selected word line by applying the initial voltage $V_{031}$ to the word line and subsequently increasing the voltage on the word line to the end voltage $V_{e31}$ in a series of voltage sub-steps $\Delta V_3$.

In response to the word line, and thus the control gates of the target memory cells, reaching the end voltage $V_{e31}$, the word line may be discharged from the end voltage $V_{e31}$, and the program verify performed. If the program verify indicates that one or more of the target memory cells are programmed to level 3 (e.g., to threshold voltages that lie within the certain range for level 3), the programming to level 3 is completed for those memory cells. For some embodiments, end voltage $V_{e31}$ may be substantially the same as the initial programming voltage $V_{S3}$ in FIG. 4, e.g., substantially the same as the voltage of voltage pulse $V_{pp31}$ in FIG. 4, and the step voltage ΔV'pp3 may be substantially the same as the step voltage ΔVpp3 in FIG. 4.

If less than a threshold number (which again, in some embodiments, could be all) of the target memory cells remain unprogrammed to level 3, the step voltage ΔV'pp3 is added to initial voltage $V_{031}$ of programming voltage pulse $V'_{pp31}$ to produce programming voltage pulse $V'_{pp32}$. Programming voltage pulse $V'_{pp32}$ is then applied to the selected word line. These remaining target memory cells unprogrammed to level 3 receive programming voltage pulse $V'_{pp32}$ while the target memory cells already programmed to level 3 and other untargeted memory cells associated with the word line are inhibited from programming. Note that programming voltage pulse $V'_{pp31}$ and programming voltage pulse $V'_{pp32}$ may be substantially the same (e.g., the same), except that the respective voltages of programming voltage pulse $V'_{pp32}$ are respectively higher than the respective voltages of programming voltage pulse $V'_{pp31}$ by the voltage step ΔV'pp3.

Applying the programming voltage pulse $V'_{pp32}$ to the selected word line may include setting the initial voltage $V_{032}$ of programming voltage pulse $V'_{pp32}$ to $V_{032}=V_{031}+\Delta V'pp3$ and applying the initial voltage $V_{032}$ of programming voltage pulse $V'_{pp32}$ to the selected word line. The voltage on the selected word line may then be increased, step by step, in a plurality sub-steps until an end voltage level $V_{e32}$ is reached. In other words, the voltage of the programming voltage pulse $V'_{pp32}$ may increase with time from the initial voltage $V_{032}$ to the end voltage $V_{e32}$.

The voltage of the programming voltage pulse $V'_{pp32}$ may increase at substantially the same rate (e.g., the same rate) as the voltage of the programming voltage pulse $V'_{pp31}$. For example, the voltage of pulse $V'_{pp32}$ may be increased in the same series of voltage sub-steps $\Delta V_3$ as the voltage of pulse $V'_{pp31}$. In other words, the programming voltage pulse $V'_{pp32}$ may be generated on the selected word line by applying the initial voltage $V_{032}$ to the word line and by subsequently increasing the voltage on the word line to the end voltage $V_{e32}$ in a series of voltage sub-steps $\Delta V_3$. For some embodiments, end voltage $V_{e32}$ may be substantially the same as the voltage of voltage pulse $V_{pp32}$ in FIG. 4. In response to the word line, and thus the control gates of the target memory cells, reaching the end voltage level $V_{e32}$, the word line may be discharged from the end voltage $V_{e32}$, and the program verify performed.

Since the threshold voltage range spreads more at the higher program levels with time, as discussed above in conjunction with FIGS. 3A-3C, using initially narrower ranges (resulting from using smaller voltage steps at the higher levels, as in FIGS. 4 and 5) at the higher program levels can compensate for the additional spreading at the higher program levels.

Compensating for the additional spreading at the higher program levels can result in wider margins between the higher program levels, thereby reducing likelihood of the difficulties that can occur when trying to read memory cells programmed to the higher program levels.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. For example, although the foregoing embodiments were directed to memory cells configured to be programmed to one of four different program levels, the concepts disclosed herein can be applied to memory cells configured to be programmed to one of three or more program levels. Thus, for three program levels (e.g., levels 0-2), the discussion above for levels 0-2 can apply directly, while for more than four program levels (e.g., levels 0-5 or more), the discussion above can merely be extended such that for each program level 5 or above, a lesser voltage step is utilized for each higher program level. In addition, for more than four program levels, a memory cell may be targeted for programming more than two times before it reaches its desired program level. Accordingly, this application is intended to cover any adaptations or variations of the embodiments.

What is claimed is:

1. An electronic system, comprising:
a controller; and
a memory device coupled to the controller;
wherein the memory device is configured to cause a first programming voltage, applied to a memory cell, to be increased by a first voltage step while the memory cell is being programmed to a first program level, corresponding to a first data value; and
wherein the memory device is configured to cause a second programming voltage, applied to the memory cell, to be increased by a second voltage step less than the first voltage step while the memory cell is being programed to a second program level higher than the first program level and corresponding to a second data value that is different than the first data value.

2. The electronic system of claim 1, wherein the second programming voltage is greater than the first programming voltage.

3. The electronic system of claim 1, wherein the memory device is configured to cause a first program verify voltage to be applied to the memory cell before the first programming voltage is increased by the first voltage step and to cause a second program verify voltage to be applied to the memory cell before the second programming voltage is increased by the second voltage step.

4. An electronic system, comprising:
a controller; and
a memory device coupled to the controller;
wherein the memory device is configured to cause a first series of programming pulses to be applied to a memory cell while the memory cell is being programmed to a first program level, corresponding to a first data value;
wherein the memory device is configured to cause a second series of programming pulses to be applied to the memory cell while the memory cell is being programmed to a second program level that is higher than the first program level and that corresponds to a second data value that is different than the first data value; and
wherein the memory device is configured to cause voltages of the programming pulses of the first series increase at a faster rate than voltages of the programming pulses of the second series.

5. The electronic system of claim 4, wherein a first programming pulse of the second series of programming pulses has a higher voltage than a first programming pulse of the first series of programming pulses.

6. The electronic system of claim 4, wherein a first programming pulse of the second series of programming pulses has a higher voltage than a last programming pulse of the first series of programming pulses.

7. The electronic system of claim 4,
wherein the memory device is configured to cause a first program verify to be performed on the memory cell after the first series of programming pulses is applied; and wherein the memory device is configured to cause a second program verify to be performed on the memory cell after the second series of programming pulses is applied.

8. An electronic system, comprising:

a controller; and a memory device coupled to the controller;

wherein the memory device is configured to cause a first series of programming pulses to be applied to a memory cell while the memory cell is being programmed to a first program level;

wherein the memory device is configured to cause a second series of programming pulses to be applied to the memory cell while the memory cell is being programmed to a second program level that is higher than the first program level;

wherein the memory device is configured to cause voltages of the programming pulses of the first series increase at a faster rate than voltages of the programming pulses of the second series;

wherein the memory device is configured to cause a first program verify to be performed on the memory cell after the first series of programming pulses is applied;

wherein the memory device is configured to cause a second program verify to be performed on the memory cell after the second series of programming pulses is applied;

wherein the memory device is configured to cause a third series of programming pulses to be applied the memory cell, while the memory cell is being programmed to the first program level, after the memory cell fails the first program verify; and wherein the memory device is configured to cause a fourth series of programming pulses to be applied to the memory cell, while the memory cell is being programmed to the second program level, after the memory cell fails the second program verify.

9. The electronic system of claim 8, wherein a first programming pulse of the fourth series of programming pulses has a higher voltage than a first programming pulse of the third series of programming pulses.

10. The electronic system of claim 8, wherein the memory device is configured to cause the voltages of the programming pulses of the first series to increase at a same rate as voltages of the programming pulses of the third series, and wherein the memory device is configured to cause the voltages of the programming pulses of the second series to increase at the same rate as voltages of the programming pulses of the fourth series.

11. An electronic system, comprising:

a controller; and a memory device coupled to the controller;

wherein the memory device is configured to cause a first series of programming pulses to be applied to a memory cell while the memory cell is being programmed to a first program level;

wherein the memory device is configured to cause a second series of programming pulses to be applied to the memory cell while the memory cell is being programmed to a second program level that is higher than the first program level;

wherein the memory device is configured to cause voltages of the programming pulses of the first series increase at a faster rate than voltages of the programming pulses of the second series;

wherein the memory device is configured to cause a third series of programming pulses to be applied to the memory cell while the memory cell is being programmed to a third program level that is higher than the second program level; and wherein memory device is configured to cause the voltages of the programming pulses of the second series increase at a faster rate than voltages of the programming pulses of the third series.

12. An electronic system, comprising:

a controller; and a memory device coupled to the controller;

wherein the memory device is configured to program a first memory cell to a first program level by causing a first series of programming pulses to be applied to the first memory cell, wherein the programming pulses of the first series have voltages that sequentially increase by a certain first voltage;

wherein the memory device is configured to program a second memory cell to a second program level that is higher than the first program level by causing a second series of programming pulses to be applied to the second memory cell, wherein the programming pulses of the second series have voltages that sequentially increase by a certain second voltage less than the certain first voltage; and wherein the first program level corresponds to a first data value and the second program level corresponds to a second data value different than the first data value.

13. The electronic system of claim 12, wherein the first memory cell and the second memory cell are the same memory cell.

14. An electronic system, comprising:

a controller; and a memory device coupled to the controller;

wherein the memory device is configured to program a first memory cell to a first program level by causing a first series of programming pulses to be applied to the first memory cell, wherein the programming pulses of the first series have voltages that sequentially increase by a certain first voltage;

wherein the memory device is configured to program a second memory cell to a second program level that is higher than the first program level by causing a second series of programming pulses to be applied to the second memory cell, wherein the programming pulses of the second series have voltages that sequentially increase by a certain second voltage less than the certain first voltage; and wherein the memory device is configured to program a third memory cell to a third program level that is higher than the second program level by causing a third series of programming pulses to be applied to the third memory cell, wherein the programming pulses of the third series have voltages that sequentially increase by a certain third voltage less than the certain second voltage.

15. The electronic system of claim 12, wherein the memory device is configured to cause a program verify to be applied after each of the programming pulses of the first series is applied to the first memory cell and after each of the programming pulses of the second series is applied to the second memory cell.

16. The electronic system of claim 12, wherein the memory device is configured to cause the voltages of the programming pulses of the first series to increase at a first rate and to cause the voltages of the programming pulses of the second series to increase at a second rate that is lower than the first rate.

17. An electronic system, comprising:

a controller; and a memory device coupled to the controller;

wherein the memory device is configured to attempt to program a first target memory cell to a first program level by causing a programming voltage pulse having a first programming voltage to be applied to a selected access line coupled to the first target memory cell;

if the voltage pulse having the first programming voltage fails to program the first target memory cell to the first program level, the memory device is configured to cause a programming voltage pulse having a second programming voltage to be applied to the selected access line, wherein the second programming voltage exceeds the first programming voltage by a first step voltage;

wherein the memory device is configured to attempt to program a second target memory cell to a second program level higher than the first program level by causing a programming voltage pulse having a third programming voltage to be applied to a selected access line coupled to the second target memory cell, wherein the third programming voltage exceeds the second programming voltage; and if the voltage pulse having the third programming voltage fails to program the second target memory cell to the second program level, the memory device is configured to cause a programming voltage pulse having a fourth programming voltage to be applied to the selected access line coupled to the second target memory cell, wherein the fourth programming voltage exceeds the third programming voltage by a second step voltage less than the first step voltage.

18. The electronic system of claim 17, wherein the first target memory cell and the second memory target cell are the same target memory cell.

19. The electronic system of claim 17, wherein the selected access line coupled to the first memory target cell and the selected access line coupled to the second target memory cell are the same access line.

20. The electronic system of claim 17, the memory device is configured to determine whether the programming voltage pulse having the second programming voltage programmed the first target memory cell to the first program level and/or to determine whether the programming voltage pulse having the fourth programming voltage programmed the second target memory cell to the second program level.

* * * * *